United States Patent
Venkateshwaran et al.

(10) Patent No.: US 6,316,822 B1
(45) Date of Patent: Nov. 13, 2001

(54) MULTICHIP ASSEMBLY SEMICONDUCTOR

(75) Inventors: Vaiyapuri Venkateshwaran; Ji Cheng Yang, both of Singapore (SG)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/396,632

(22) Filed: Sep. 15, 1999

(30) Foreign Application Priority Data

Sep. 16, 1998 (SG) ...................................... 9802864

(51) Int. Cl.$^7$ .................................................. H01L 23/495
(52) U.S. Cl. ......................... 257/666; 257/676; 257/778; 257/724
(58) Field of Search ..................... 257/666, 676, 257/777, 778, 686, 724

(56) References Cited

U.S. PATENT DOCUMENTS

| | | | |
|---|---|---|---|
| 5,471,369 | * | 11/1995 | Honda et al. . |
| 5,646,829 | * | 7/1997 | Sota . |
| 5,719,436 | * | 2/1998 | Kuhn . |
| 5,780,926 | * | 7/1998 | Seo . |
| 5,877,478 | * | 3/1999 | Ando . |
| 5,898,220 | * | 4/1999 | Ball . |
| 6,069,025 | * | 5/2000 | Kim . |
| 6,072,243 | * | 6/2000 | Nakanishi . |
| 6,077,724 | * | 6/2000 | Chen . |
| 6,087,718 | * | 7/2000 | Cho . |
| 6,118,176 | * | 9/2000 | Tao et al. . |

* cited by examiner

Primary Examiner—Sheila V. Clark
(74) Attorney, Agent, or Firm—Gary C. Honeycutt; Fred Telecky; Arthur I. Navarro

(57) ABSTRACT

Multichip semiconductor assembly comprising a semiconductor chip stack comprising first and second chips, each having an active surface including an integrated circuit and a plurality of input/output contact pads, and a passive surface; a leadframe for interconnecting semiconductor integrated circuits having first and second surfaces, a plurality of leads, and a chip mount pad, said leadframe being disposed between said first and second chips, and at least a portion of said passive surface of said first chip being attached to said first surface of said chip mount pad; bonding wire connections between each of said contact pads of said first chip to said first surface of one of said leads, respectively; and solder ball connections between each of said contact pads of said second chip to said second surface of one of said leads, respectively, whereby the connections to at least one of said leads are common between said first and second chips.

21 Claims, 2 Drawing Sheets

MULTICHIP ASSEMBLY SEMICONDUCTOR

The present invention is related in general to the field of semiconductor devices and processes, and more specifically to assembly methods for integrated circuit chips resulting in multichip devices in a single package, having advanced performance characteristics yet fast turn-around development times.

BACKGROUND OF THE INVENTION

It is advantageous for many applications of semiconductor devices to arrange the needed devices in close proximity, even in a cluster. When only two, or few more, semiconductor chips are needed, various arrangements have been proposed in order to achieve the desired proximity, and to enable a minimization of required space. Typically, these arrangements are assemblies of semiconductor chips on a substrate, with or without a specific encapsulation. For these arrangements, the term "multichip module" is commonly used. For an encapsulated assembly, the term "multichip package" has been introduced. For many years, there has been a rather limited market for multichip modules and multichip packages, but driven by the rapidly expanding penetration of integrated circuit applications, this market is recently growing significantly in size. In order to participate in this market, though, the multichip products have to meet several conditions.

The multichip product has to offer the customer performance characteristics not available in single-chip products. This means, the multichip product has to leapfrog the development of single-chip product.

The multichip product has to be available to the customer at short notice. This means, the multichip product should use readily available components and fabrication methods.

The multichip product has to offer the customer a cost advantage. This means, the design and fabrication of the multichip product has to avoid unconventional or additional process steps.

The multichip product has to offer low cost-of-ownership. This means, it has to operate reliably based on built-in reliability.

Numerous multichip packages have been described in publications and patents. For instance, U.S. Pat. No. 4,862,322, Aug. 29, 1989 (Bickford et al.) entitled "Double Electronic Device Structure having Beam Leads Solderlessly Bonded between Contact Locations on each Device and Projecting Outwardly from Therebetween" describes a structure of two chips facing each other, in which the input/output terminals are bonded by beam leads. The high cost, however, of materials, processing and controls never allowed the beam lead technology to become a mainstream fabrication method.

In U.S. Pat. No. 5,331,235, Jul. 19, 1994 (H. S. Chun) entitled "Multi-Chip Semiconductor Package", tape-automated bonding plastic tapes are used to interconnect two chips of identical types, facing each other, into pairs. One or more of these pairs are then assembled into an encapsulating package, in which the plastic tapes are connected to metallic leads reaching outside of the package to form the leads or pins for surface mount and board attach. The high cost of the plastic tapes and the lack of batch processing kept the technology of tape-automated bonding at the margins of the semiconductor production.

Several proposals have been made of multichip devices in which two or more chips are arranged side by side, attached to a supporting substrate or to leadframe pads. An example is U.S. Pat. No. 5,352,632, Oct. 4, 1994 (H. Sawaya) entitled "Multichip Packaged Semiconductor Device and Method for Manufacturing the Same". The chips, usually of different types, are first interconnected by flexible resin tapes and then sealed into a resin package. The tapes are attached to metallic leads which also protrude from the package for conventional surface mounting. Another example is U.S. Pat. No. 5,373,188, Dec. 13, 1994 (Michii et al.) entitled "Packaged Semiconductor Device including Multiple Semiconductor Chips and Cross-over Lead". The chips, usually of different types, are attached to leadframe chip pads; their input/output terminals are wire bonded to the inner lead of the leadframe. In addition, other leads are used under or over the semiconductor chips in order to interconnect terminals which cannot be reached by long-spanned wire bonding. Finally, the assembly is encapsulated in a plastic package. In both of these examples, the end products are large, since the chips are placed side by side. In contrast, today's applications require ever shrinking semiconductor products, and board consumption is to be minimized.

U.S. Pat. No. 5,438,224, Aug. 1, 1995 (Papageorge et al.) entitled "Integrated Circuit Package having a Face-to-Face IC Chip Arrangement" discloses an integrated circuit (IC) package with a stacked IC chip arrangement placed on a circuit substrate. Two chips are positioned face to face, with a substrate made of tape-automated bonding tape or flex circuit interposed between the chips to provide electrical connection among the terminals of the flip chip and external circuitry; a separate mechanical support is needed for the assembly. in addition to this cost, fabrication is difficult due to the lack of rigid support for the chips.

U.S. Pat. No. 5,770,480, Jun. 23, 1998 (Ma et al.) entitled "Method of Leads between Chips Assembly" increases the IC density by teaching the use of leadframe fingers to attach to the bond pads of multiple chips employing solder or conductive bumps. While in the preferred embodiments both chips of a set are identical in function, the method extends also to chips with differing bond pad arrangements, In this case, however, the leadframe needs customized configuration and non-uniform lengths of the lead fingers, especially since the use of bond wires is excluded. The manufacture of these so-called variable-leads-between-chips involves costly leadframe fabrication equipment and techniques. In addition, a passivation layer is required, to be disposed between the two chips and the customized lead fingers, in order to prevent potential electrical shorts, adding more material and processing costs.

An urgent need has therefore arisen for a coherent, low-cost method of fabricating multichip packages based on available chip designs and assembly and encapsulation techniques. The method should be flexible enough to be applied for different semiconductor product families and a wide spectrum of design and process variations, should add no additional cost to the existing fabrication methods, and deliver high-quality and high-reliability products. Preferably, these innovations should be accomplished while shortening production cycle time and increasing throughput.

SUMMARY OF THE INVENTION

The present innovation provides a method for increasing integrated circuit density and creating novel performance characteristics. The multichip device comprises a stack of typically two semiconductor chips with a leadframe including a plurality of leads disposed between the chips. The device is produced by connecting each of the chip contact pads to one of the leads, respectively, whereby the connections to at least one of the leads are common between the first and second chips. The interconnection method may be wire bonding or solder reflow, whatever the designs of the chips-to-be-connected require.

The chips of the stack can be found in many semiconductor device families; preferred embodiments of the invention include chip pairs of dynamic random-access memories (DRAMs) and static random-access memories (SRAMs), FLASH memories and SRAMs, digital signal processors (DSPs) and SRAMs, and application-specific integrated circuits (ASICs) and SRAMs. In these examples, each chip of the stacks is readily available. If one would endeavor to duplicate the performance of the stacked chips by a single chip, it would not only require precious design and development time, but would result in large-area chips of initially lower fabrication yield, and large-area packages consuming valuable board space. Consequently, the invention helps to alleviate the space constraint of continually shrinking applications such as cellular communications, pagers, hard disk drives, laptop computers and medical instrumentation.

Other embodiments of the invention include stacks of chips identical in function, such as a pair of DRAMs designed for flip-chip assembly by solder reflow. In these applications, portions of the leads of the metallic leadframe are formed in an undulating pattern designed to securely accommodate the solder balls for the flip chip assembly. Preferred contours are shaped to position solder balls between 0.1 and 0.5 mm diameter. In addition, the invention emphasizes the metallurgical preparation of the lead surfaces in order to promote solder wetting. A preferred surface preparation comprises selective and sequential depositions of layers of nickel and a noble metal such as palladium, or alloys thereof. In order to minimize thermomechanical stress on the solder joints, it is preferable that the size of the solder connections as well as the coefficients of thermal expansion of the various assembly components are selected based on stress modeling using finite element analysis.

The multichip assembly of the present invention has the additional benefit of reducing trace inductance by shortening conductive paths, designing conductive losses in bonding wires and solder balls approximately equal, and minimizing both. This effort is supported by sharing signals on a common conductor whenever possible. The signal path is considerably reduced compared to a simple assembly of two individual packages next to each other, just connected by conductive paths on a printed substrate or circuit board.

According to the invention, the assembly is encapsulated in a molded package. The preferred method is transfer molding using the so-called "3-P" technology. Emphasis is placed on cleanliness of the molding compound by prepacking and sealing it in plastic forms which are only ruptured at time of usage, and on preventing the deleterious adhesion to the mold cavity walls of the molding compound by covering thin continuous plastic films over the mold walls.

It is an object of the present invention to provide a low-cost method and system for packaging multichip devices in thin overall package profile by disposing the leads of metallic leadframes between the chips of a stack.

Another object of the present invention is to be flexible in the multichip assembly, utilizing both wire bonding and solder reflow for connecting the chip terminals to the leads.

Another object of the present invention is to enhance production throughput by more precisely positioning solder balls in low-cost lead undulations.

Another object of the present invention is to improve product quality by promoting solder wetting and maintaining a temperature difference between wire bonding and solder reflow.

Another object of the invention is to provide reliability assurance through in-process control at no extra cost.

Another object of the invention is to introduce assembly concepts which are flexible so that they can be applied to many families of semiconductor products, and are general so that they can be applied to several future generations of products.

Another object of the invention is to minimize the cost of capital investment and to use the installed fabrication equipment base.

These objects have been achieved by the teachings of the invention concerning the modifications of metallic leads, arrangements of chip sets, and flexible assembly methods. Various modifications have been employed for the assembly and encapsulation of chip stacks.

In one embodiment of the invention, the multichip assembly comprises a stack of two chips. The bond pads of the first chip are disposed around the periphery of the chip; the pads are connected to the first surface of the leads of the leadframe by bond wires. The bond pads of the second chip are connected to the second surface of the leads by solder ball reflow.

In another embodiment of the invention, the multichip assembly comprises also a stack of two chips. The bond pads of the first chip are disposed along the center line of the chip the pads are connected to the second surface of the leads of the leadframe by bond wires. The bond pads of the second chip are also connected to the second surface of the leads, yet by solder ball reflow.

In yet another embodiment of the invention, both chips of a stack of two chips are connected to the leads by solder ball reflow. However, the leads are fabricated in an undulated fashion so that the solder balls of the chips can be securely positioned, thus simplifying the multichip assembly and improving manufacturing yield. Moreover, metal layers are deposited onto the base material of the leadframe in order to promote solder wetting.

In all embodiments mentioned, the assemblies are encapsulated in molded packages. The mold compound not only protects the bond wires, but concurrently acts as a stress-absorbing underfill for the solder joints.

The technical advances represented by the invention, as well as the objects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

The present invention is related to an arrangement of two or more semiconductor integrated circuit chips in a multi-chip assembly. As defined herein, the term "multichip" refers to a set of two or more semiconductor integrated circuit chips which are in close proximity and electrically connected together so that they function as a unit. Commonly, they are also physically coupled by being assembled on a substrate or board, and encapsulated in a package. In one embodiment of the invention, the chips of a set are dissimilar relative to their size, design, and function; in another embodiment they are identical. In yet another embodiment of the invention the assembly method is the same for the chips; in another embodiment they may differ from chip to chip.

Figure 1:
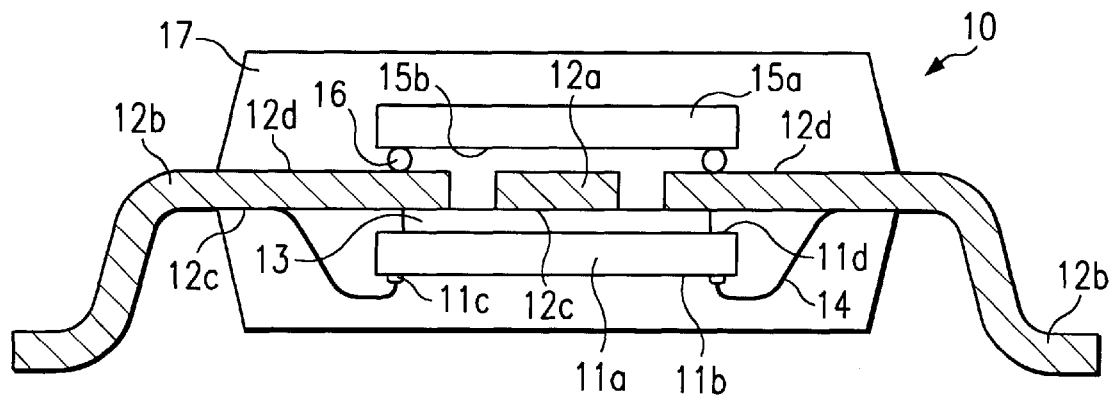
FIG. 1 is a simplified schematic cross section of a semiconductor multichip assembly, encapsulated in a molded package, according to a first embodiment of the invention.

FIG. 1 is a simplified cross sectional view of a semiconductor multichip assembly that is generally designated 10. The assembly comprises a set of two semiconductor integrated circuit (IC) chips. One or both may be made of silicon, silicon germanium, gallium arsenide or any other semiconductor material used in electronic device production. The thickness is typically in the range from 200 to 400 $\mu$m. The first chip 11a has an active surface 11b which includes the integrated circuit and a plurality of input/output contact pads 11c disposed around the perimeter of chip 11a. Chip 11a further has a passive surface 11d. At least a portion of this passive surface 11d is attached to the first surface 12c of the chip mount pad 12a of a leadframe by means of an adhesive layer 13. This adhesive layer may be made of, for example, a dispensed glue which forms a thin layer and can be cured, or a double-sided adhesive polyimide tape, adhesive glue, epoxy, or thermoplastic adhesive.

In FIG. 1, the leadframe comprises the chip mount pad 12a and a plurality of leads 12b, having first surface 12c and second surface 12d. For the present invention, the leadframe interconnects the integrated circuit chips by disposing the leadframe between the chips of the set. The leadframe portions are made solely of metal. Typical choices are copper, copper alloys, iron-nickel alloys ("Alloy 42"), and invar. For reasons of easy and cost-effective manufacturing, it has been common practice to manufacture leadframes from thin sheets of metal such as copper (typical thickness range 120 to 250 $\mu$m). The desired shape of the leadframe is etched or stamped from this original sheet. In this manner, an individual lead of the leadframe takes the form of a thin metallic strip with its particular geometric shape determined by the design. For most purposes, the length of a typical lead is considerably longer than its width. The area of chip mount pad 12a is frequently minimized for reasons of molded package integrity (avoidance of mold compound delamination). For technical reasons of wire bonding, the chip mount pad 12a may sometimes not be in the same horizontal plane as the leads 12b, but slightly offset (about 10 to 20 $\mu$m).

Each of the input/output contact pads on the active surface 11b of chip 11a is connected to the first surface 12c of one of the leads 12b of the leadframe, respectively, by bonding wires 14. The wire bonding process begins after the chip 11a has been adhered to the chip pad 12a and the attach material 13 has been cured. Leadframe and chip are positioned on a heated pedestal to raise their temperature to between 170 and 300° C. A wire typically of gold, gold-beryllium alloy, other gold alloy, or copper, having a diameter typically ranging from 18 to 32 $\mu$m is strung through a heated capillary where the temperature usually ranges from 200 to 500° C. At the tip of the wire, a liquid ball is created using either a flame or a spark technique. The capillary is moved towards the chip bonding pad and the ball is pressed against the metallization of the bonding pad (typically aluminum, aluminum-copper alloy, or copper, between 0.5 and 1 $\mu$m thick). A combination of compression force and ultrasonic energy create the formation of gold-aluminum intermetallics and thus the strong metallurgical bond. In case of copper wire on copper pad, only metal interdiffusion takes place in order to generate the strong weld. Ball pitches of 75 to 50 $\mu$m can be achieved.

Moving the capillary in a predetermined and computer-controlled manner through the air will create a wire looping of exactly defined shape; for instance, recent technical advances allow the formation of rounded, trapezoidal, linear or looped paths. Finally, the capillary reaches the first surface 12c of the lead, is lowered to touch it with an imprint of the capillary, thus forming a metallurgical stitch bond. The lateral dimension of the stitch imprint is about three times the wire diameter; its exact shape depends on capillary wall thickness and footprint. Recent technical advances allow the formation of wire looping with a minimum length of bonding wire by moving the bonding capillary the shortest feasible distance to the lead. As a consequence, the looping of the wire can cross the silicon surface at a height of approximately 10 $\mu$m and high looping spans are no longer an issue. The wire is finally flamed off to release the capillary. In order to stabilize the lead for the pressure of the stitch, the chip attach layer 13 is shown in FIG. 1 to extend from the chip mount pad 12a to the lead. This optional extension is particularly helpful when the chip mount pad 12a is small.

The advantage of bonding wires is their tolerance to mechanical stress, which appears unavoidably in an assembly of parts having different coefficients of thermal expansion, when the assembly operates through temperature cycles. However, bonding wires have to be protected against mechanical damage, preferably by a molded package; also, their contribution to parasitic inductance has to be accounted for in the circuit design.

The second chip 15a on FIG. 1 has an active surface 15b which includes the integrated circuit and a plurality of input/output contact pads. In the example depicted in FIG. 1, chips 11a and 15a are not face to face. Each of the input/output contact pads on the active surface 15b is connected to the second surface 12d of one of the leads 12b of the leadframe, respectively, by solder balls 16. It is essential for the present invention that in this fashion, the connections to at least one of the leads 12b are common between the first chip 11a and the second chip 15a.

As used herein, the term solder "ball" does not imply that the solder contacts are necessarily spherical; they may have various forms, such as semispherical, half-dome, truncated cone, or generally bump, or a cylinder with straight, concave or convex outlines. The exact shape is a function of the deposition technique (such as evaporation, plating, or prefabricated units) and reflow technique (such as infrared or radiant heat), and the material composition. Generally, a mixture of lead and tin is used; other material include indium or indium/tin alloys. The melting temperature should be lower than the wire bonding temperature used for bonding chip 11a, because the wire bonding operation is commonly performed before the solder reflow attachment of chip 15a. Several methods are available to achieve consistency of geometrical shape by controlling amount of material and uniformity of reflow temperature. Typically, the diameter of the solder balls ranges from 0.1 to 0.5 mm.

In order to insure reliable attachment of the solder to the leads (as well as to the chip contact pads), preparations have to be taken for achieving proper wetting of the lead surfaces 12d. In those lead surface portions which are involved in solder attachment, sequential layers of nickel and a noble metal are deposited over the base metal of the leadframe. Palladium is the preferred choice for the noble metal: also a flash of gold may be used. The chip contact pads may be covered by layers of a refractory metal (such as chromium, molybdenum, titanium tungsten, or titanium/tungsten alloy) and a noble metal (such as palladium, gold, platinum or platinum-rich alloy, silver or silver alloy). Good wetting is achieved because at reflow temperature, the thin palladium layer is dissolved into the solder so that is attaches reliably to the clean nickel underneath.

It is advantageous to encapsulate the finished multichip assembly 10 in a molded package 17. Today's transfer molding processes control viscosity, pressure, time, and temperature so carefully that wire sweep of the bonding wires is no longer a failure mechanism If packages with very thin profile have to be produced, materials having very low viscosity and high adhesion should be used. They are best processed by the "3-P" molding technology. According to this method, clean molding materials are prepacked and sealed in plastic forms (for instance, in elongated, so-called "pencil" shape) which are only ruptured at time of usage. The deleterious adhesion to the mold cavity walls of the molding compound is prevented by covering the walls with thin continuous plastic films. Suitable epoxy-based thermoset resins or silicone-based elastomerics are commercially available from Sin Etsu Chemical Corporation, Japan, or Kuala Lumpur, Malaysia, or from Sumitomo Bakelite Corporation, Japan, or Singapore, Singapore. These materials also contain the appropriate fillers needed for shifting the coefficient of thermal expansion closer to that of silicon, and for enhancing the strength and flexibility of the molding material after curing.

The molding temperature (usually from 140 to 220° C.) has to be selected such that is lower than the reflow temperature of solder balls 16. Even minute spaces, for instance around and between the solder balls 16, can be reliably filled with molding material. Voids or other cosmetic defects, are eliminated, and mechanical stress on the solder joints is minimized by this "underfilling" process.

As the last process step, the leadframe will be trimmed (i.e., the supporting metal rails and dam bars will be excised) and formed. Herewith, the leads are pressed into a form desired for board attach by soldering. Choices include gull wing shape, as shown in FIGS. 1, 2, 4 and 5, or J-lead shape, both generally used for surface mount attach technology, or pin shape for traditional through-hole attach technology.

For different IC types, preferred chip choices in FIG. 1 comprise a FLASH memory chip as first chip 11a and a SRAM chip as second chip 15a. Other combinations comprise sets which substitute for embedded memory, for example DRAM as chip 11a, ASIC as chip 11a, DSP as chip 11a, always with SRAM as chip 15a. In addition, stacks can be formed different semiconductor types, such as a gallium arsenide chip as 11a combined with a silicon SRAM chip as 15a.

Figure 2:
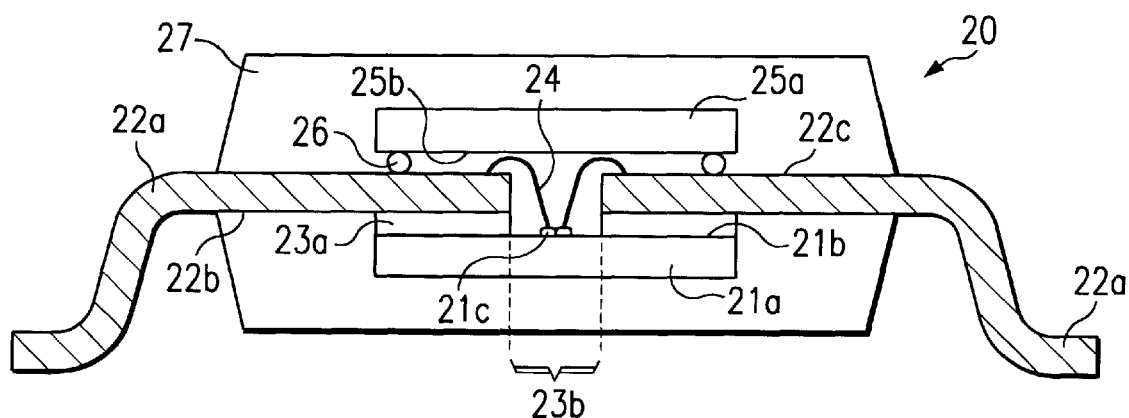
FIG. 2 is a simplified schematic cross section of a semiconductor multichip assembly, encapsulated in a molded package, according to a second embodiment of the invention.

Another multichip assembly which is particularly suitable for DRAM/SRAM chip sets, is schematically depicted in FIG. 2. The simplified cross sectional view of the semiconductor multichip assembly shown in FIG. 2 is generally designated 20. The assembly comprises a stack of two semiconductor IC chips. The first chip 21a has an active surface 21b which includes the integrated circuit and a plurality of input/output contact pads 21c disposed along the center line of chip 21a. At least a portion of this active surface 21b is attached to the first surface 22b of the leads 22a of a leadframe by means of an adhesive layer 23a. This adhesive layer may be made of, for example, a double-sided adhesive polyimide tape, adhesive glue, epoxy, or thermoplastic adhesive. Adhesive layer 23a has an opening 23b such that contact pads 21c are not covered by adhesive layer 23a.

In FIG. 2, the leadframe comprises a plurality of leads 22a, having first surface 22b and second surface 22c, but does not have a chip pad like the leadframe of FIG. 1. For the present invention, the leadframe interconnects the IC chips by disposing the leadframe between the chips of the set. The leadframe portions are made solely of metal. Each of the input/output contact pads on the active surface 21b of chip 21a is connected to the second surface 22c of one of the leads 22a of the leadframe, respectively, by bonding wires 24. Using the recent advance in wire bonding described above in conjunction with FIG. 1, the looping of bonding wires 24 in FIG. 2 is formed with a minimum length of bonding wire by moving the bonding capillary the shortest feasible distance over the surface 22c of the lead 22a. As a consequence, the looping of wires 24 can cross the surface 22c at a height of approximately 10 $\mu$m and approach the surface at a low angle (at the stitch, there is no minimum height for a ball needed, nor is there a heat-affected wire zone which would be mechanically weak for bending or other deformation stresses). Because of this minimum wire looping, high looping spans are no longer an issue.

Consequently, the second chip 25a in FIG. 2 can be attached to leads 22a by relatively small solder balls 26 (diameter range about 0.1 to 0.5 mm). Chip 25a has an active surface 25b which includes the integrated circuit and a plurality of input/output contact pads. In the example depicted in FIG. 2, chips 25a and 21a are face to face. Each of the input/output contact pads on the active surface 25b is connected to the second surface 22c of one of the leads 22a of the leadframe, respectively, by solder balls 26. It is essential for the present invention, that in this fashion, the connection to at least one of the leads 22a are common between the first chip 21a and the second chip 25a.

As described above in conjunction with FIG. 1, for reliable solder wetting and attachment to lead surface 22c in FIG. 2, in those lead surface portions which are involved in solder attachment, sequential layers of nickel and palladium (or gold) are deposited over the base metal of the leadframe.

It is advantageous to encapsulate the finished multichip assembly 20 of FIG. 2 in a molded package 27, similar to the assembly described in FIG. 1. The molding material protects the bonding wires (without causing "wire sweep") and minimizes operational thermomechanical stress on the solder joints. Again, the "3-P" molding technology is most promising to fabricate packages with thin profiles by applying molding material with extra low viscosity and high adhesion.

Figure 3:
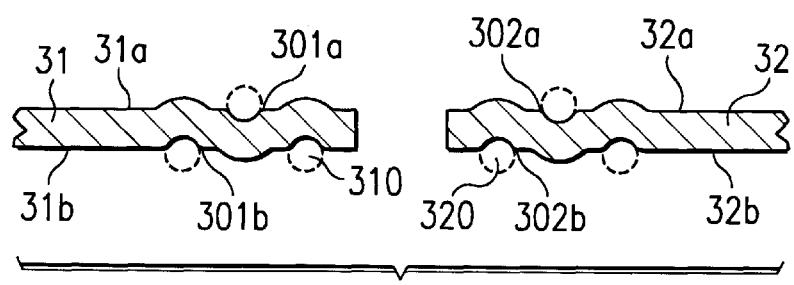
FIG. 3 is a simplified cross section of lead portions of a lead frame according to the invention.

Another embodiment of the invention is depicted in simplified and schematic manner in FIG. 3. Shown are two portions of a couple of leads 31 and 32 of a leadframe which has a plurality of leads. The leadframe is manufactured from metal sheets between about 120 to 250 $\mu$m thick. Each lead has a first surface (31a and 32a, respectively) and a second surface (31b and 32b, respectively). The lead portions comprise an undulating pattern. This pattern has been manufactured by pressing indents (or dimples) into the first and the second surfaces. in FIG. 3, the indents pressed into the first surfaces are designated 301a and 302a, respectively; the indents pressed into the second surfaces are designated 302a and 302b, respectively.

The depths, rims and contours of the indents are suitable for positioning one solder ball into each indent. In this fashion, the positioning of solder balls and of chips carrying solder balls relative to the leads can be greatly facilitated; escapes and poor placements are practically eliminated, thus increasing production throughput and yield. The diameters of the solder balls range from 100 to 500 $\mu$m; as described above, they comprise lead/tin alloys chosen for a melting temperature consistent with the multichip assembly process. In FIG. 3, the solder balls 310 and 320, respectively, are indicated by dashed outlines. In order to generate the appropriate undulating pattern, the thickness of the starting material of the leadframe and the diameter of the solder balls are correlated. Dependent on the ball diameter range to be processed, the indents are pressed into both lead surfaces; care is taken that the contours remain safely within the elastic regime of the leadframe material; overstretch or mircocracks of the leadframe material are avoided. The rims of the indents are not critical; they may be relatively sharp, as shown in FIG. 3, or more rounded. As an empirical rule, the lead width should preferably be equal to or larger than the solder ball feature size, and the space between adjacent leads should be equal to or larger than half of the solder ball feature size. If the available space is smaller, the indents can be placed in a staggered pattern.

It is essential to prepare the surfaces of the undulating lead tips shown in FIG. 3 metallurgically such that wetting of the leads during reflow of the solder balls is promoted. The method is described above in conjunction with FIG. 1. In essence, sequential layers of nickel and a noble metal such as palladium are deposited over the base metal of the leads tips, commonly copper (or Alloy 42).

Figure 4:
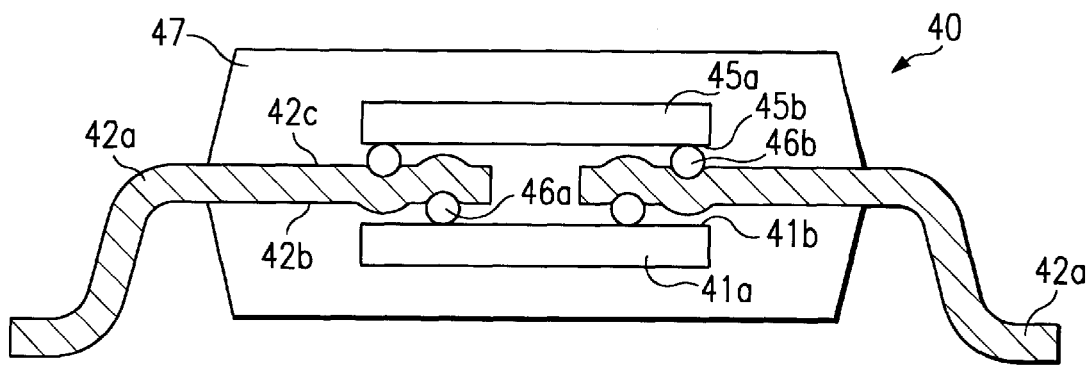
FIG. 4 is a simplified schematic cross section of a semiconductor multichip assembly, encapsulated in a molded package, according to a third embodiment of the invention.
Figure 5:
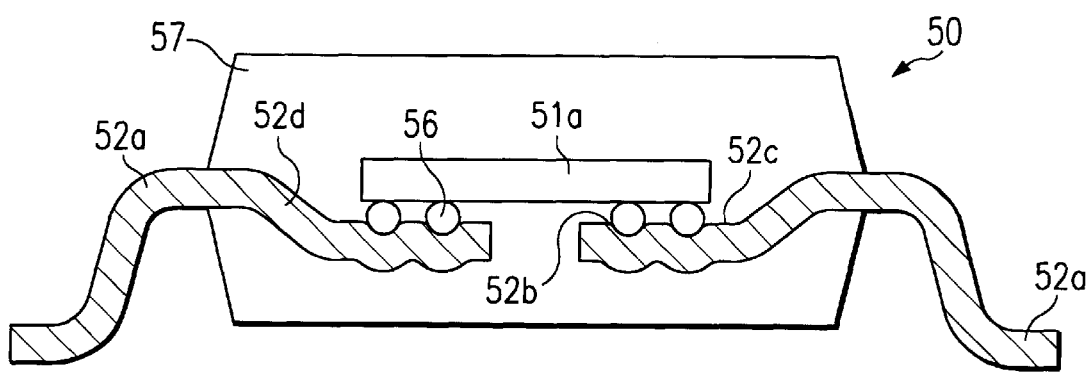
FIG. 5 is a simplified schematic cross section of a semiconductor single chip assembly, encapsulated in a molded package, according to a fourth embodiment of the invention.

Embodiments of the invention using leadframes having undulating leads for multichip and single-chip semiconductor assemblies are illustrated in FIGS. 4 and 5. In FIG. 4, a multichip assembly generally designated 40 comprises a semiconductor chip set of two chips 41a and 45a, each having an active surface 41b and 45b, respectively, including an integrated circuit and a plurality of input/output contact pads.

A leadframe for interconnecting semiconductor integrated circuits has a plurality of leads 42a; portions of these leads comprise an undulating pattern and a surface metallurgy for promoting solder wetting. Indents are formed into the leads from both surfaces 42b and 42c. The leadframe is disposed between chips 41a and 45a such that the active surface 41b of chip 41a is in front of the active surface 45b of chip 45a; the two chips are facing each other.

Connections between each contact pad of chip 41a to one of the leads 42a, respectively, is accomplished by solder balls 46a positioned in indents into surface 42b of lead 42a. Likewise, connections between each contact pad of chip 45a and one of the leads 42a, respectively, is accomplished by solder balls 46b positioned in indents into surface 42c of lead 42a. The connections to at least one of the leads 42a are common between chip 41a and 45a. In this fashion, a multichip stack is assembled.

The chip set in FIG. 5 may comprise chips of identical types, or of different types. The chips may comprise silicon, silicon germanium. or gallium arsenide, or any other semiconductor material used in electronic device production. In particular, the chip set may comprise chips of identical or different integrated circuit types.

Even if solder assembled chips are mechanically not as sensitive as wire bonded chips, it is advantageous to encapsulate the assembly in a molded package 47. The molding compound acts as "underfilling" material for the solder connections, thus minimizing thermomechanical stress on the solder joints during device operation.

In FIG. 5, a single chip assembly generally designated 50 comprises a semiconductor chip 51a having an integrated circuit including a plurality of input/output contact pads. A leadframe for interconnecting semiconductor integrated circuits has a plurality of leads 52a; portions of these leads comprise an undulating pattern and a surface metallurgy for promoting solder wetting. Indents are formed into the leads from surface 52c. In addition, the leads comprise an offset 52d in order to allow the chip 51a to be assembled approximately in the plane of leads 52a, resulting in a so-called "balanced package" in which approximately equal thicknesses of molding material 57 are on either surface of the chip. Balanced packages have been found to be especially stable against thermomechanical stress and thus to avoid stress-related delamination of molding material from any surface inside the package.

Connections between each contact pad of chip 51a to one of the leads 52a, respectively, is accomplished by solder balls 56 positioned in indents 52b of surface 52c of leads 52a. After encapsulating the assembly in a molded package, the molding compound 57 acts as "underfill" material for the solder connections, thus minimizing thermomechanical stress on the solder joints during device operation.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A multichip semiconductor assembly comprising:
   a semiconductor chip stack comprising first and second chips, each having an integrated circuit including a plurality of input/output contact pads;
   a leadframe for interconnecting semiconductor integrated circuits having a plurality of leads, said leadframe being disposed between said first and second chips; and
   connection means between each of said contact pads of said first chip to one of said leads, respectively, and solder balls between each of said contact pads of said second chip and one of said leads, respectively, whereby the connections to at least one of said leads are common between said first and second chips.

2. The multichip semiconductor assembly according to claim 1 wherein said leadframe comprises solely metallic portions.

3. The multichip semiconductor assembly according to claim 1 wherein at least one of said chips is attached to a chip mount portion of said leadframe.

4. The multichip semiconductor assembly according to claim 1 wherein at least one of said chips is attached to said plurality of leads of said leadframe.

5. The multichip semiconductor assembly according to claim 1 wherein said first chip connection means of comprise bonding wires.

6. The multichip semiconductor assembly according to claim 1 wherein said chip stack comprises chips of different types.

7. The multichip semiconductor assembly according to claim 1 wherein said chip stack comprises chips of identical types.

8. The multichip semiconductor assembly according to claim 1 wherein at least one of said chips comprises silicon, silicon germaniun, gallium arsenide or any other semiconductor material used in electronic device production.

9. The multichip semiconductor assembly according to claim 1 wherein said assembly is encapsulated in a molded package.

10. A multichip semiconductor assembly comprising:

a semiconductor chip stack comprising first and second chips, each having an active surface including an integrated circuit and a plurality of input/output contact pads, and a passive surface;

a leadframe for interconnecting semiconductor integrated circuits having first and second surfaces, a plurality of leads, and a chip mount pad, said leadframe being disposed between said first and second chips, and at least a portion of said passive surface of said first chip being attached to said first surface of said chip mount pad;

bonding wire connections between each of said contact pads of said first chip to said first surface of one of said leads, respectively; and solder ball connections between each of said contact pads of said second chip to said second surface of one of said leads, respectively, whereby the connections to at least one of said leads are common between said first and second chips.

11. The multichip semiconductor assembly according to claim 10 wherein said leadframe comprises solely metallic portions.

12. The multichip semiconductor assembly according to claim 10 wherein said chip stack comprises chips of different semiconductor types.

13. The multichip semiconductor assembly according to claim 10 wherein said chip stack comprises chips of different integrated circuit types.

14. The multichip semiconductor assembly according to claim 10 wherein said chip stack comprises chips of identical types.

15. The multichip semiconductor assembly according to claim 10 wherein said assembly is encapsulated in a molded package.

16. A multichip semiconductor assembly comprising:

a semiconductor chip stack comprising first and second chips, each having an active surface including an integrated circuit and a plurality of input/output contact pads;

a leadframe for interconnecting semiconductor integrated circuits having first and second surfaces and a plurality of leads, said leadframe being disposed between said first and second chips, and at least a portion of said active surface of said first chip being attached to said first surface of said plurality of leads;

bonding wire connections between each of said contact pads of said first chip to said second surface of one of said leads, respectively; and solder ball connections between each of said contact pads of said second chip to said second surface of one of said leads, respectively, whereby the connections to at least one of said leads are common between said first and second chips.

17. The multichip semiconductor assembly according to claim 16 wherein said leadframe comprises solely metallic portions.

18. The multichip semiconductor assembly according to claim 16 wherein said chip stack comprises chips of different semiconductor types.

19. The multichip semiconductor assembly according to claim 16 wherein said chip stack comprises chips of different integrated circuit types.

20. The multichip semiconductor assembly according to claim 16 wherein said chip tack comprises chips of identical types.

21. The multichip semiconductor assembly according to claim 16 wherein said assembly is encapsulated in a molded package.

* * * * *